(12) United States Patent
Lin et al.

(10) Patent No.: US 10,236,903 B2
(45) Date of Patent: Mar. 19, 2019

(54) CHARGE COMPENSATION CIRCUIT AND ANALOG-TO-DIGITAL CONVERTER WITH THE SAME

(71) Applicant: MEDIATEK INC., Hsin-Chu (TW)

(72) Inventors: Ying-Zu Lin, Taichung (TW); Rong-Sing Chu, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/495,144

(22) Filed: Apr. 24, 2017

(65) Prior Publication Data

US 2017/0346498 A1 Nov. 30, 2017

Related U.S. Application Data

(60) Provisional application No. 62/342,219, filed on May 27, 2016.

(51) Int. Cl.
| H03M 1/12 | (2006.01) |
| H03M 1/46 | (2006.01) |
| H03M 1/06 | (2006.01) |
| H03M 1/80 | (2006.01) |

(52) U.S. Cl.
CPC ......... *H03M 1/468* (2013.01); *H03M 1/0602* (2013.01); *H03M 1/804* (2013.01)

(58) Field of Classification Search
CPC ......... H03M 1/12; H03M 1/1245; H03M 1/40
USPC .................................................. 341/155, 163
See application file for complete search history.

(56) References Cited

U.S. PATENT DOCUMENTS

| 4,458,237 | A | 7/1984 | Domogalla | |
| 5,852,415 | A | 12/1998 | Cotter | |
| 7,755,521 | B1* | 7/2010 | Kuramochi | H03M 1/1061 341/118 |
| 8,451,151 | B2* | 5/2013 | Lin | H03M 1/1061 341/110 |
| 8,981,973 | B2* | 3/2015 | Kumar | H03M 1/0617 341/118 |
| 9,106,243 | B2 | 8/2015 | Lee | |
| 9,641,189 | B2* | 5/2017 | Maddox | H03M 1/1071 |
| 2002/0084927 | A1 | 7/2002 | Krymski | |
| 2010/0207791 | A1 | 8/2010 | Ohnhaeuser | |

FOREIGN PATENT DOCUMENTS

DE 102006029734 A1 1/2008

OTHER PUBLICATIONS

Lin, Y.Z., et al.; "A 8.2-mW 10-b 1.6-GSs 4x TI SAR ADC with Fast Reference Charge Neutralization and Background Timing-Skew Calibration in 16-nm CMOS;" IEEE; 2016 Symposium on VLSI Circuits Digest of Technical Papers; 2016; pp. 204-205.

(Continued)

*Primary Examiner* — Brian K Young
(74) *Attorney, Agent, or Firm* — Winston Hsu

(57) ABSTRACT

A charge compensation circuit for use in an analog-to-digital converter (ADC) includes at least one capacitor and at least one logic circuit. A first terminal of the capacitor is coupled to a reference voltage of the analog-to-digital converter. The logic circuit is configured to adjust a voltage at a second terminal of the capacitor according to a control signal. The control signal is determined according to at least one output bit from the analog-to-digital converter.

27 Claims, 7 Drawing Sheets

(56) References Cited

OTHER PUBLICATIONS

Jeon, Y.D., et al.; "A 9.15mW 0.22mm2 10b 204MSs Pipelined SAR ADC in 65nm CMOS;" IEEE; 2010; pp. 1-4.
Wang, Y., et al.; "Charge-Compensation-Based Reference Technique for Switched-Capacitor ADCs;" IEEE; 2015; pp. 2257-2260.

* cited by examiner

CHARGE COMPENSATION CIRCUIT AND ANALOG-TO-DIGITAL CONVERTER WITH THE SAME

CROSS REFERENCE TO RELATED APPLICATIONS

This application claims the benefit of U.S. Provisional Application No. 62/342,219, filed on May 27, 2016, the entirety of which is incorporated by reference herein.

BACKGROUND OF THE INVENTION

Field of the Invention

The disclosure generally relates to a charge compensation circuit, and more specifically, to a charge compensation circuit for use in an analog-to-digital converter.

Description of the Related Art

In electronics, an analog-to-digital converter (ADC) is a system that converts an analog signal into a digital signal. In comparison to the ADC, a digital-to-analog converter (DAC) performs the reverse function. An analog-to-digital converter may also provide an isolated measurement such as an electronic device that converts an input analog voltage or current to a digital number proportional to the magnitude of the voltage or current. Typically the digital output will be a two's complement binary number that is proportional to the input.

There is a reference voltage in each type of analog-to-digital converter. Ideally, the reference voltage should be a constant value. As a matter of fact, when a conversion process is performed by the analog-to-digital converter, some discharging paths may be formed from the reference voltage to a ground voltage. The discharging paths may cause a voltage-drop and degrade the reliability of the reference voltage. Accordingly, there is a need to propose a novel solution for overcoming the problem of the prior art.

BRIEF SUMMARY OF THE INVENTION

In one exemplary embodiment, the invention is directed to a charge compensation circuit for use in an analog-to-digital converter (ADC). The charge compensation circuit includes a first capacitor and a first logic circuit. A first terminal of the first capacitor is coupled to a reference voltage of the analog-to-digital converter. The first logic circuit adjusts a voltage at a second terminal of the first capacitor according to a first control signal. The first control signal is determined according to a first output bit from the analog-to-digital converter.

In some embodiments, the analog-to-digital converter is a successive approximation register (SAR) analog-to-digital converter. In some embodiments, the first logic circuit includes a first buffer coupled between a supply voltage and a ground voltage. An input terminal of the first buffer is arranged for receiving the first control signal, and an output terminal of the first buffer is coupled to the second terminal of the first capacitor. In some embodiments, the charge compensation circuit further includes a second capacitor and a second logic circuit. A first terminal of the second capacitor is coupled to the reference voltage of the analog-to-digital converter. The second logic circuit adjusts a voltage at a second terminal of the second capacitor according to a second control signal. The second control signal is determined according to a second output bit from the analog-to-digital converter. In some embodiments, the first output bit and the second output bit are sequentially generated by the analog-to-digital converter. In some embodiments, the second logic circuit includes a second buffer coupled between the supply voltage and the ground voltage. An input terminal of the second buffer is arranged for receiving the second control signal, and an output terminal of the second buffer is coupled to the second terminal of the second capacitor. In some embodiments, the charge compensation circuit further includes a third capacitor and a third logic circuit. A first terminal of the third capacitor is coupled to the reference voltage of the analog-to-digital converter. The third logic circuit adjusts a voltage at a second terminal of the third capacitor according to a combination of the first control signal and the second control signal. In some embodiments, the third logic circuit includes an XOR gate and a third buffer coupled between the supply voltage and the ground voltage. In some embodiments, a first input terminal of the XOR gate is arranged for receiving the first control signal, a second input terminal of the XOR gate is arranged for receiving the second control signal, and an output terminal of the XOR gate is coupled to an input terminal of the third buffer. An output terminal of the third buffer is coupled to the second terminal of the third capacitor.

In another exemplary embodiment, the invention is directed to an analog-to-digital converter. The analog-to-digital converter includes a charge compensation circuit. The charge compensation circuit includes a first capacitor and a first logic circuit. A first terminal of the first capacitor is coupled to a reference voltage. The first logic circuit adjusts a voltage at a second terminal of the first capacitor according to a first control signal.

In some embodiments, the first logic circuit includes a first buffer coupled between a supply voltage and a ground voltage. An input terminal of the first buffer is arranged for receiving the first control signal, and an output terminal of the first buffer is coupled to the second terminal of the first capacitor. In some embodiments, the analog-to-digital converter further includes a first capacitor array, a second capacitor array, a comparator, a successive approximation register (SAR) logic circuit, a current source, and a resistor. The first capacitor array has a first input node, and is coupled to the reference voltage. The second capacitor array has a second input node, and is coupled to the reference voltage. A first input terminal of the comparator is coupled to the first capacitor array, and a second input terminal of the comparator is coupled to the second capacitor array. The successive approximation register logic circuit is coupled to an output terminal of the comparator, and generates a first output bit. The current source supplies a current to the reference voltage. The resistor is coupled between the reference voltage and the ground voltage. The first control signal is determined according to the first output bit. In some embodiments, the charge compensation circuit further includes a second capacitor and a second logic circuit. A first terminal of the second capacitor is coupled to the reference voltage. The second logic circuit adjusts the voltage at a second terminal of the second capacitor according to a second control signal. The successive approximation register logic circuit sequentially generates the first output bit and a second output bit. The second control signal is determined according to the second output bit. In some embodiments, the second logic circuit includes a second buffer coupled between the supply voltage and the ground voltage. An input terminal of the second buffer is arranged for receiving the second control signal, and an output terminal of the second buffer is coupled to the second terminal of the second capacitor. In some embodiments, the charge compensation circuit further includes a third capacitor and a third logic circuit. A first terminal of the third capacitor is coupled to the reference voltage. A third logic circuit adjusts a voltage at a second terminal of the third capacitor according to a combination of the first control signal and the second control signal. In some embodiments, the third logic circuit includes an XOR gate and a third buffer coupled between the supply voltage and the ground voltage. In some embodiments, a first input terminal of the XOR gate is arranged for receiving the first control signal, a second input terminal of the XOR gate is arranged for receiving the second control signal, and an output terminal of the XOR gate is coupled to an input terminal of the third buffer. An output terminal of the third buffer is coupled to the second terminal of the third capacitor.

In one exemplary embodiment, the invention is directed to a method for charge compensation. The method includes the steps of: generating a first control signal according to a first output bit from an analog-to-digital converter; and adjusting, by a first logic circuit, the voltage at a second terminal of a first capacitor according to the first control signal. A first terminal of the first capacitor is coupled to a reference voltage of the analog-to-digital converter.

In some embodiments, the method further includes: generating a second control signal according to a second output bit from the analog-to-digital converter; and adjusting, by a second logic circuit, the voltage at a second terminal of a second capacitor according to the second control signal. A first terminal of the second capacitor is coupled to the reference voltage of the analog-to-digital converter. In some embodiments, the method further includes: adjusting, by a third logic circuit, the voltage at a second terminal of a third capacitor according to a combination of the first control signal and the second control signal. A first terminal of the third capacitor is coupled to the reference voltage of the analog-to-digital converter.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
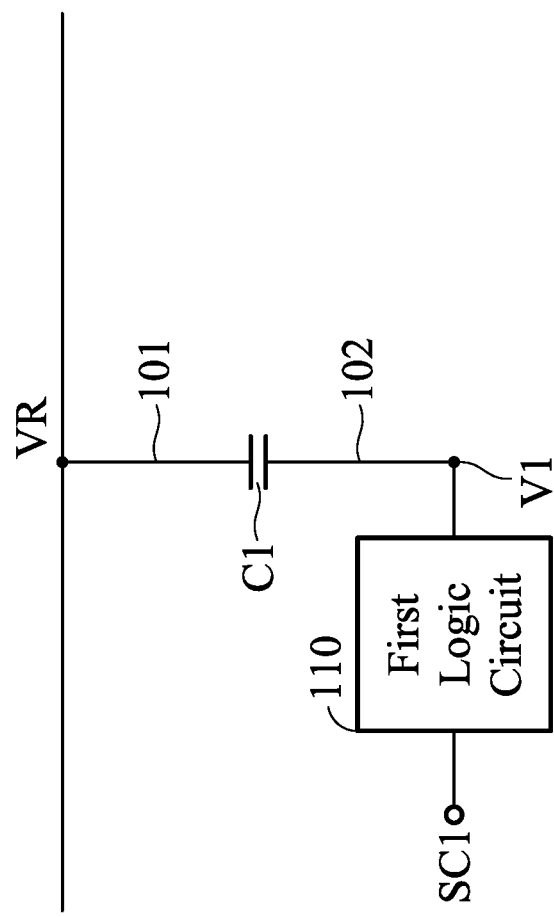
FIG. 1 is a diagram of a charge compensation circuit according to an embodiment of the invention.

FIG. 1 is a diagram of a charge compensation circuit 100 according to an embodiment of the invention. The charge compensation circuit 100 may be applied in an analog-to-digital converter (ADC) (not shown). The analog-to-digital converter may be a successive approximation register (SAR) analog-to-digital converter, but it is not limited thereto. As shown in FIG. 1, the charge compensation circuit 100 at least includes a first capacitor C1 and a first logic circuit 110. The first capacitor C1 has a first terminal 101 and a second terminal 102. The first terminal 101 of the first capacitor C1 is coupled to a reference voltage VR of the analog-to-digital converter. The reference voltage VR may be used for a comparing process performed by a comparator and capacitor arrays in the analog-to-digital converter. The first logic circuit 110 is coupled to the second terminal 102 of the first capacitor C1, and is configured to adjust a voltage V1 at the second terminal 102 of the first capacitor C1 according to a first control signal SC1. The first logic circuit 110 may include a variety of combinational logic circuits. The first control signal SC1 is determined according to a first output bit from the analog-to-digital converter. For example, the first output bit may be the most significant bit (MSB).

To be brief, the charge compensation circuit 100 is capable of stabilizing the reference voltage VR of the analog-to-digital converter with a negative feedback mechanism. The circuit structure of the proposed charge compensation circuit is described in detail in the following embodiments. It should be understood that these embodiments and figures are just exemplary, rather than limitations of the invention.

Figure 2:
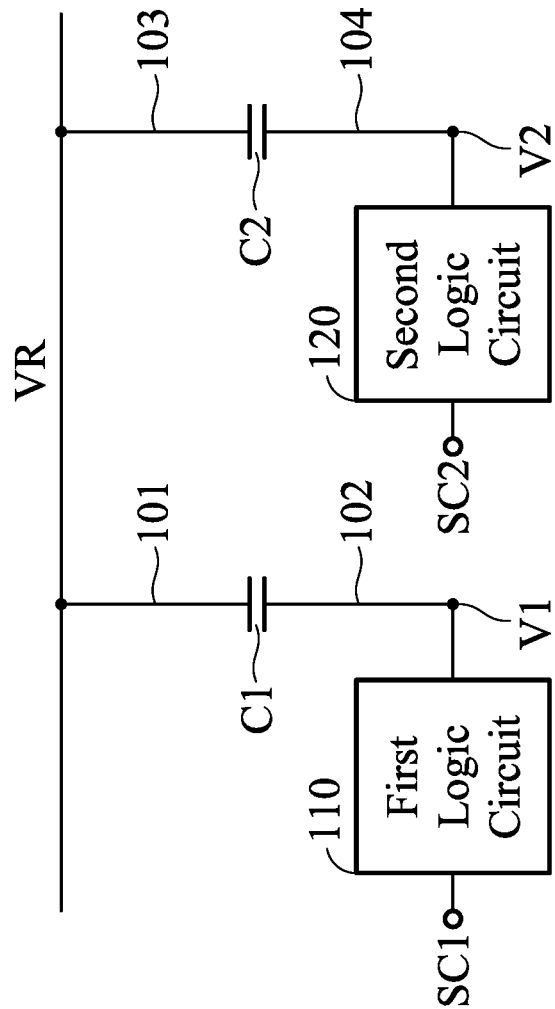
FIG. 2 is a diagram of a charge compensation circuit according to an embodiment of the invention.

FIG. 2 is a diagram of a charge compensation circuit 200 according to an embodiment of the invention. FIG. 2 is similar to FIG. 1. The difference between the two embodiments is that the charge compensation circuit 200 further includes a second capacitor C2 and a second logic circuit 120. The second capacitor C2 has a first terminal 103 and a second terminal 104. The first terminal 103 of the second capacitor C2 is coupled to the reference voltage VR of the analog-to-digital converter. The second logic circuit 120 is coupled to the second terminal 104 of the second capacitor C2, and is configured to adjust a voltage V2 at the second terminal 104 of the second capacitor C2 according to a second control signal SC2. The second logic circuit 120 may include a variety of combinational logic circuits. The first control signal SC2 is determined according to a second output bit from the analog-to-digital converter. In some embodiments, the first output bit and the second output bit are sequentially generated by the analog-to-digital converter. The second output bit may follow and be next to the first output bit. Other features of the charge compensation circuit 200 of FIG. 2 are similar to those of the charge compensation circuit 100 of FIG. 1. Accordingly, the two embodiments can achieve to similar levels of performance.

Figure 3:
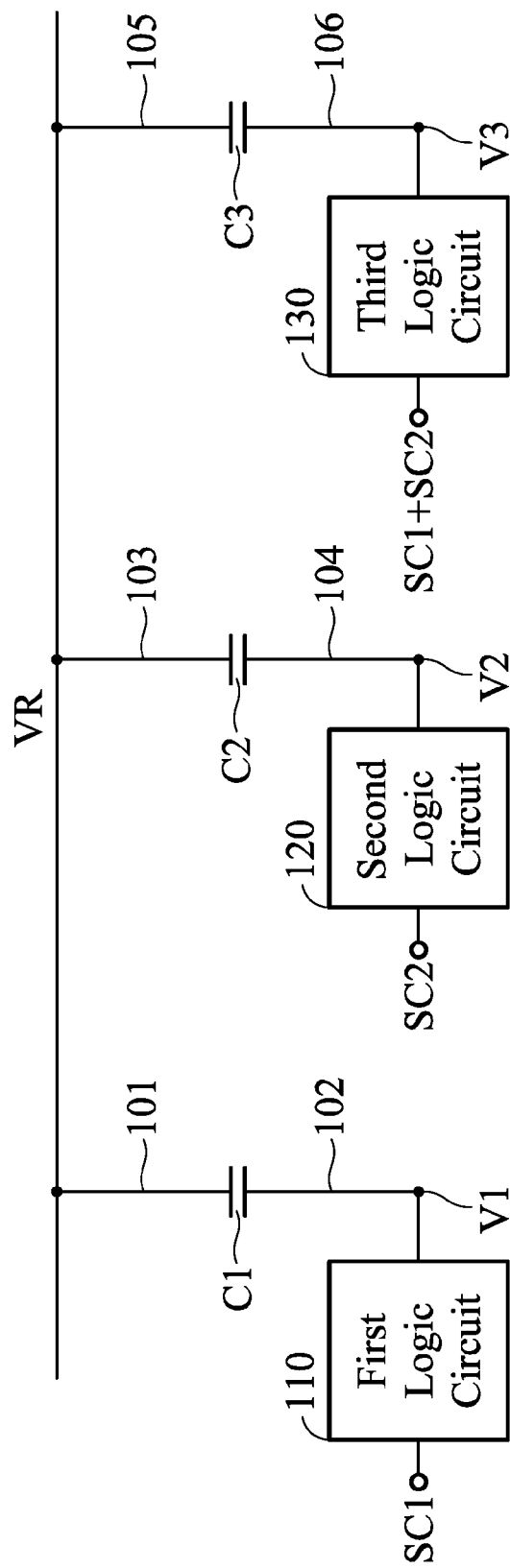
FIG. 3 is a diagram of a charge compensation circuit according to an embodiment of the invention.

FIG. 3 is a diagram of a charge compensation circuit 300 according to an embodiment of the invention. FIG. 3 is similar to FIG. 2. The difference between the two embodiments is that the charge compensation circuit 300 further includes a third capacitor C3 and a third logic circuit 130. The third capacitor C3 has a first terminal 105 and a second terminal 106. The first terminal 105 of the third capacitor C3 is coupled to the reference voltage VR of the analog-to-digital converter. The third logic circuit 130 is coupled to the second terminal 106 of the third capacitor C3, and is configured to adjust a voltage V3 at the second terminal 106 of the third capacitor C3 according to a combination of the first control signal SC1 and the second control signal SC2. The combination of the first control signal SC1 and the second control signal SC2 may be determined according to a combination of the first output bit and the second output bit from the analog-to-digital converter. The third logic circuit 130 may include a variety of combinational logic circuits. Other features of the charge compensation circuit 300 of FIG. 3 are similar to those of the charge compensation circuit 200 of FIG. 2. Accordingly, the two embodiments can achieve to similar levels of performance.

Figure 4:
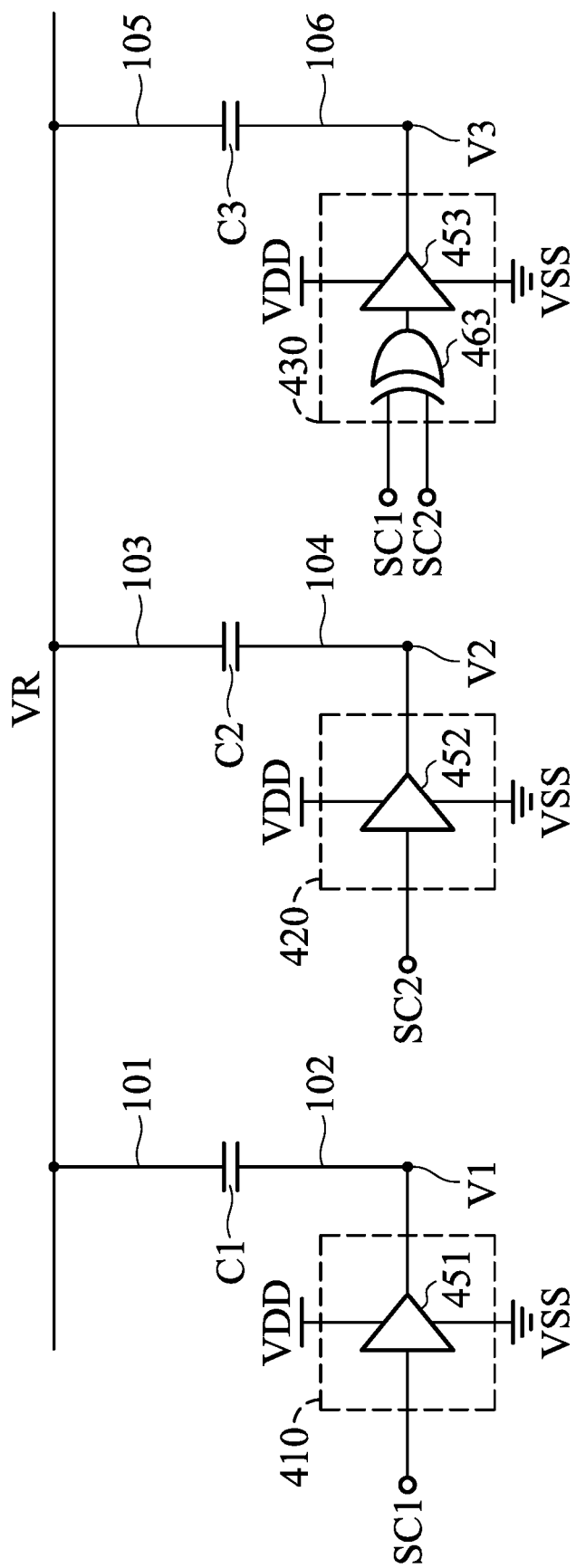
FIG. 4 is a diagram of a charge compensation circuit according to an embodiment of the invention.

FIG. 4 is a diagram of a charge compensation circuit 400 according to an embodiment of the invention. FIG. 4 is similar to FIG. 3. In the embodiment of FIG. 4, the charge compensation circuit 400 includes a first capacitor C1, a second capacitor C2, a third capacitor C3, a first logic circuit 410, a second logic circuit 420, and a third logic circuit 430. Each of the aforementioned logic circuits is implemented with a respective specific circuit structure. The first terminal 101 of the first capacitor C1 is coupled to a reference voltage VR of an analog-to-digital converter. The first logic circuit 410 includes a first buffer 451 coupled between a supply voltage VDD and a ground voltage VSS. The first buffer 451 has an input terminal and an output terminal. The input terminal of the first buffer 451 is arranged for receiving the first control signal SC1, and the output terminal of the first buffer 451 is coupled to the second terminal 102 of the first capacitor C1. The first terminal 103 of the second capacitor C2 is coupled to the reference voltage VR of the analog-to-digital converter. The second logic circuit 420 includes a second buffer 452 coupled between the supply voltage VDD and the ground voltage VSS. The second buffer 452 has an input terminal and an output terminal. The input terminal of the second buffer 452 is arranged for receiving the second control signal SC2, and the output terminal of the second buffer 452 is coupled to the second terminal 104 of the second capacitor C2. The first terminal 105 of the third capacitor C3 is coupled to the reference voltage VR of the analog-to-digital converter. The third logic circuit 430 includes an XOR gate 463 and a third buffer 453 coupled between the supply voltage VDD and the ground voltage VSS. The XOR gate 463 has a first input terminal, a second input terminal, and an output terminal. The first input terminal of the XOR gate 463 is arranged for receiving the first control signal SC1, and the second input terminal of the XOR gate 463 is arranged for receiving the second control signal SC2. The third buffer 453 has an input terminal and an output terminal. The output terminal of the XOR gate 463 is coupled to the input terminal of the third buffer 453, and the output terminal of the third buffer 453 is coupled to the second terminal 106 of the third capacitor C3. Other features of the charge compensation circuit 400 of FIG. 4 are similar to those of the charge compensation circuit 300 of FIG. 3. Accordingly, the two embodiments can achieve to similar levels of performance.

Figure 5:
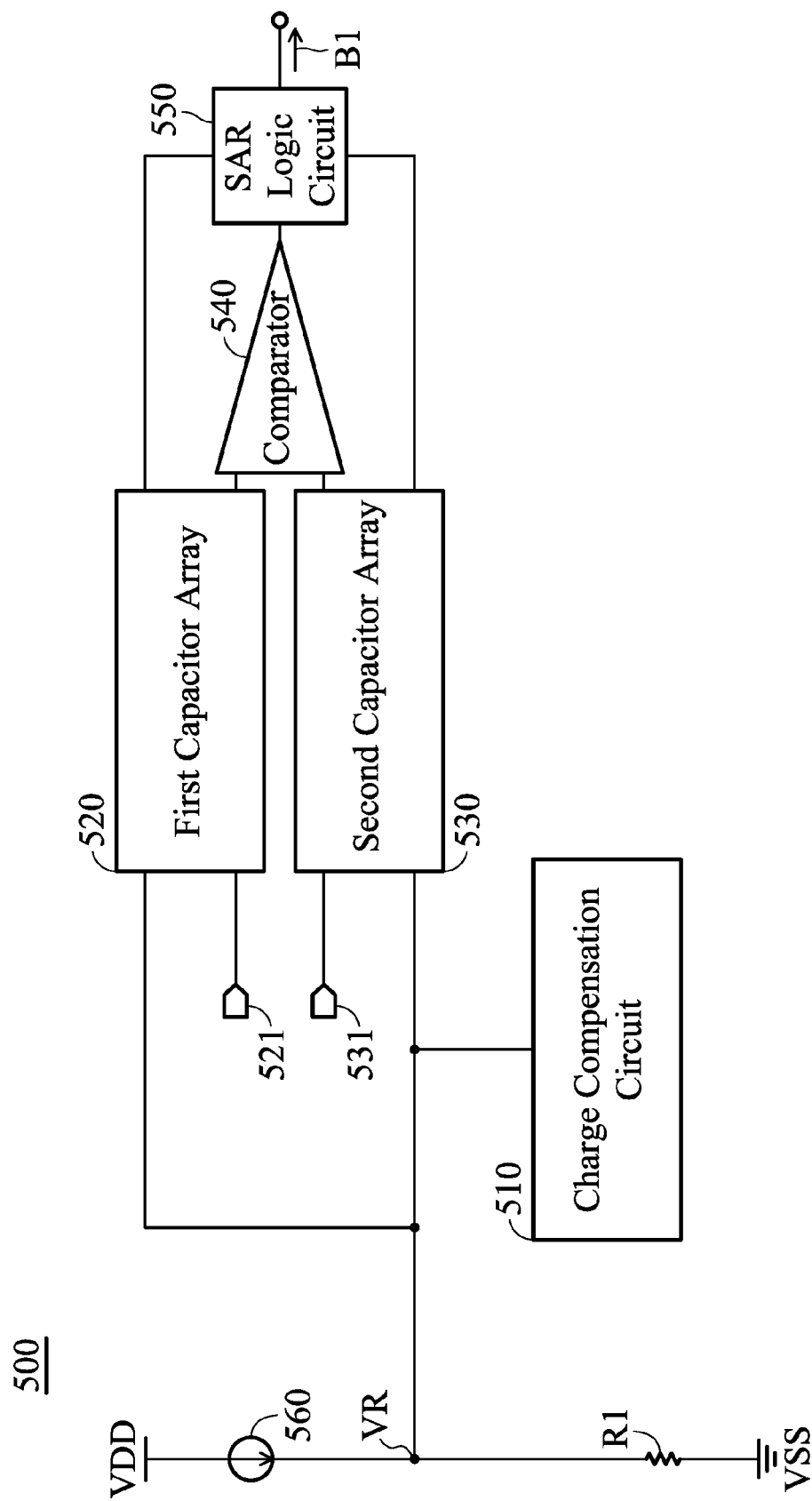
FIG. 5 is a diagram of an analog-to-digital converter (ADC) according to an embodiment of the invention.

FIG. 5 is a diagram of an analog-to-digital converter (ADC) 500 according to an embodiment of the invention. The analog-to-digital converter 500 at least includes a charge compensation circuit 510, whose circuit structure may be described in any one of the above embodiments of FIGS. 1 to 4. The charge compensation circuit 510 is capable of stabilizing a reference voltage VR of the analog-to-digital converter 500. In the embodiment of FIG. 5, the analog-to-digital converter 500 may further include one or more of the following components: a first capacitor array 520, a second capacitor array 530, a comparator 540, a successive approximation register (SAR) logic circuit 550, a current source 560, and a resistor R1. These components are merely exemplary, and they are not limitations of the invention. Each of the first capacitor array 520 and the second capacitor array 530 may include one or more sampling capacitors. The first capacitor array 520 has a first input node 521 for receiving a first input signal. The second capacitor array 530 has a second input node 531 for receiving a second input signal. The first capacitor array 520 and the second capacitor array 530 are both coupled to the reference voltage VR. The comparator 540 has a first input terminal, a second input terminal, and an output terminal. The first input terminal of the comparator 540 is coupled to the first capacitor array 520, the second input terminal of the comparator 540 is coupled to the second capacitor array 530, and the output terminal of the comparator 540 is coupled to the successive approximation register logic circuit 550. The successive approximation register logic circuit 550 is configured to generate at least a first output bit B1 according to a comparison result from the comparator 540. The first output bit B1 may be the most significant bit (MSB). The first control signal SC1 to the charge compensation circuit 510 is determined according to the first output bit B1. The current source 560 is configured to supply a current to the reference voltage VR. The resistor R1 is coupled between the reference voltage VR and a ground voltage VSS. Other features of the charge compensation circuit 510 of FIG. 5 are similar to those of the charge compensation circuit 100, 200, 300, or 400 of FIG. 1, 2, 3, or 4. Accordingly, these embodiments can achieve to similar levels of performance.

Figure 6:
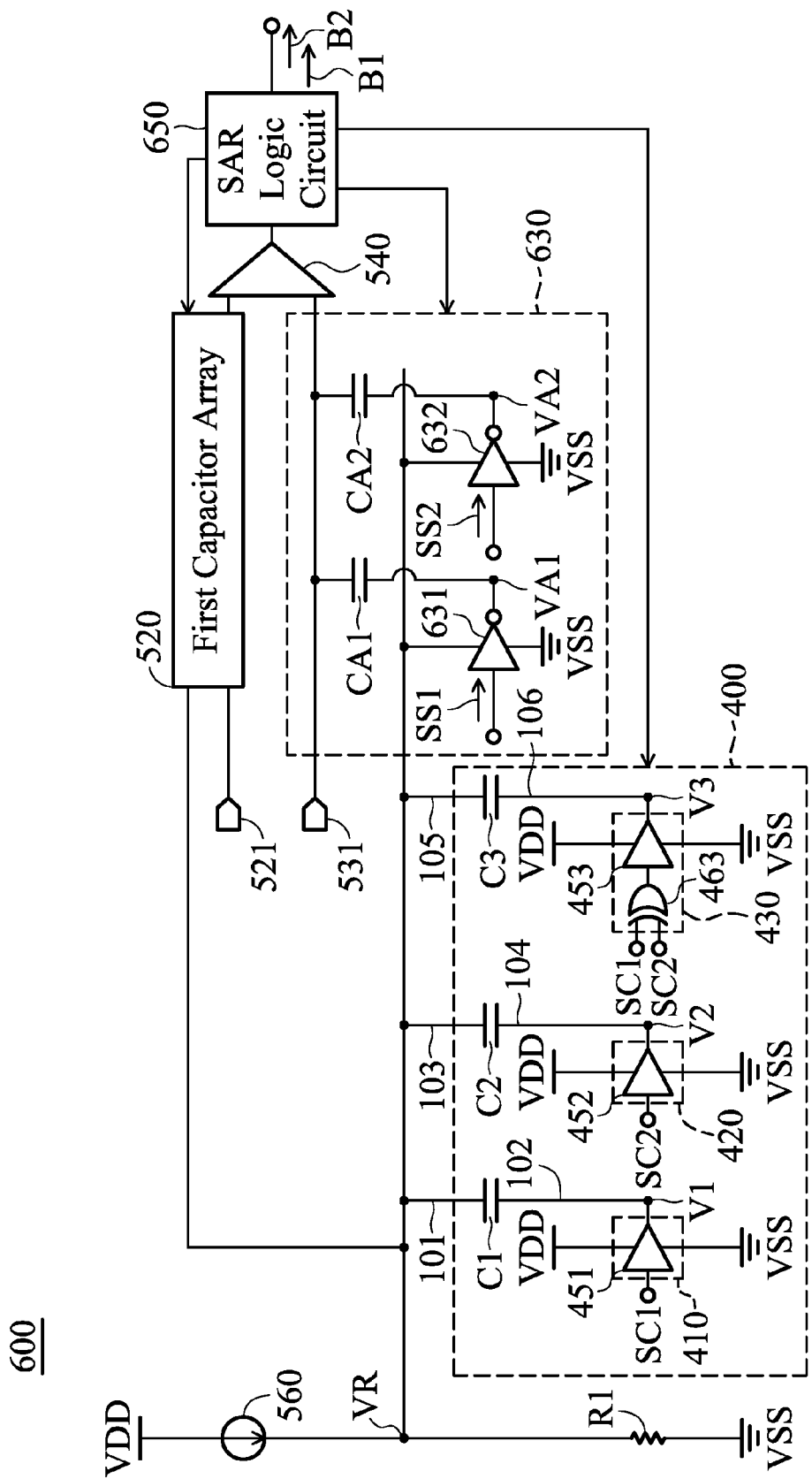
FIG. 6 is a diagram of an analog-to-digital converter according to an embodiment of the invention.

FIG. 6 is a diagram of an analog-to-digital converter 600 according to an embodiment of the invention. FIG. 6 is similar to FIG. 5. The analog-to-digital converter 600 at least includes a charge compensation circuit 400, whose circuit structure has been described in the embodiment of FIG. 4. The charge compensation circuit 400 is capable of stabilizing a reference voltage VR of the analog-to-digital converter 600. Similarly, the analog-to-digital converter 600 may further include a first capacitor array 520, a second capacitor array 630, a comparator 540, a successive approximation register (SAR) logic circuit 650, a current source 560, and a resistor R1. The functions and arrangements of the above components have been described in the embodiment of FIG. 5. The embodiment of FIG. 6 is used for the reader to easily understand the operation theory of the proposed analog-to-digital converter and charge compensation circuit therein. Thus, the circuit structure shown in FIG. 6 is merely exemplary, rather than a limitation of the invention. For example, the second capacitor array 630 may include a first sampling capacitor CA1, a second sampling capacitor CA2, a first inverter 631, and a second inverter 632. The first sampling capacitor CA1 has a first terminal and a second terminal. The first terminal of the first sampling capacitor CA1 is coupled to the second input node 531. The first inverter 631 is coupled between the reference voltage VR and the ground voltage VSS, and has an input terminal and an output terminal. The input terminal of the first inverter 631 is arranged for receiving a first switching signal SS1, and the output terminal of the first inverter 631 is coupled to the second terminal of the first sampling capacitor CA1. The second sampling capacitor CA2 has a first terminal and a second terminal. The first terminal of the second sampling capacitor CA2 is coupled to the second input node 531. The second inverter 632 is coupled between the reference voltage VR and the ground voltage VSS, and has an input terminal and an output terminal. The input terminal of the second inverter 632 is arranged for receiving a second switching signal SS2, and the output terminal of the second inverter 632 is coupled to the second terminal of the second sampling capacitor CA2. The successive approximation register logic circuit 650 is configured to sequentially generate a first output bit B1 and a second output bit B2. The first output bit B1 may be the most significant bit (MSB). The second output bit B2 may follow and be next to the first output bit B1. Generally, the first control signal SC1 and the first switching signal SS1 are determined according to the first output bit B1, and the second control signal SC2 and the second switching signal SS2 are determined according to the second output bit B2.

In some embodiments, each of the first control signal SC1 and the first switching signal SS1 has the same logic level as that of the first output bit B1, and each of the second control signal SC2 and the second switching signal SS2 has the same logic level as that of the second output bit B2. The conversion and charge compensation process of the analog-to-digital converter 600 may be performed as follows. In the beginning, the successive approximation register logic circuit 650 decodes and outputs the first output bit B1. For example, it may be assumed that the first output bit B1 has a high logic "1". The trigger of the first output bit B1 may cause both the first switching signal SS1 and the first control signal SC1 to rise to a high logic level. The first inverter 631 may pull down the voltage VA1 at the second terminal of the first sampling capacitor CA1, and it may discharge and negatively affect the reference voltage VR. At this time, for charge compensation, the first buffer 451 of the first logic circuit 410 may pull up the voltage V1 at the second terminal 102 of the first capacitor C1, and it may charge and recover the reference voltage VR. Accordingly, the first logic circuit 410 can reduce the variation in the reference voltage VR due to the switching operation of the first sampling capacitor CA1. The switching operations of the first sampling capacitor CA1 and the first capacitor C1 may be performed concurrently. On the contrary, if the first output bit B1 has a low logic "0", the first logic circuit 410 can still reduce the variation in the reference voltage VR in the opposite way.

Next, the successive approximation register logic circuit 650 decodes and outputs the second output bit B2. For example, it may be assumed that the second output bit B2 has a high logic "1". The trigger of the second output bit B2 may cause both the second switching signal SS2 and the second control signal SC2 to rise to a high logic level. The second inverter 632 may pull down the voltage VA2 at the second terminal of the second sampling capacitor CA2, and it may discharge and negatively affect the reference voltage VR. At this time, for charge compensation, the second buffer 452 of the second logic circuit 420 may pull up the voltage V2 at the second terminal 104 of the second capacitor C2, and it may charge and recover the reference voltage VR. Accordingly, the second logic circuit 420 can reduce the variation in the reference voltage VR due to the switching operation of the second sampling capacitor CA2. The switching operations of the second sampling capacitor CA2 and the second capacitor C2 may be performed concurrently. On the contrary, if the second output bit B2 has a low logic "0", the second logic circuit 420 can still reduce the variation in the reference voltage VR in the opposite way.

In addition, the third logic circuit 430 is dependent on a combination of the first output bit B1 and the second output bit B2, and it is configured to provide an additional discharging/charging path for the reference voltage VR. When the first output bit B1 and the second output bit B2 have complementary logic levels (e.g., B1/B2 may be equal to 0/1 or 1/0), the first control signal SC1 and the second control signal SC2 may also have complementary logic levels, such that the output terminal of the XOR gate 463 may output a high-logic voltage to drive the third buffer 453. Thus, the third buffer 453 of the third logic circuit 430 may pull up the voltage V3 at the second terminal 106 of the third capacitor C3, and it may further charge and recover the reference voltage VR. Such a design is suitable for application in the analog-to-digital converter 600 using a monotonic switching method. For the monotonic switching method, since the complementary output logic 0/1 or 1/0 of the first output bit B1 and the second output bit B2 consumes more switching energy, the third logic circuit 430 is added to improve the power consumption of the analog-to-digital converter 600 in this specific situation. The switching operations of the second sampling capacitor CA2 and the third capacitor C3 may be performed concurrently. On the contrary, if the first output bit B1 and the second output bit B2 have the same logic level (e.g., B1/B2 may be equal to 0/0 or 1/1), the third logic circuit 430 can still reduce the variation in the reference voltage VR in the opposite way.

The invention is not limited to the above. Each charge compensation circuit discussed in the embodiments of FIGS. 1 to 4 may be applied to the analog-to-digital converter 500 or 600. In alternative embodiments, each of the first control signal SC1 and the first switching signal SS1 may have a complementary logic level to that of the first output bit B1, and each of the second control signal SC2 and the second switching signal SS2 may have a complementary logic level to that of the second output bit B2. In other embodiments, the analog-to-digital converter 600 generates three or more output bits (e.g., 3 or 4 output bits, but it is not limited thereto), and they can determine more control signals for controlling more logic circuits and further stabilize the reference voltage VR in a similar way.

Figure 7:
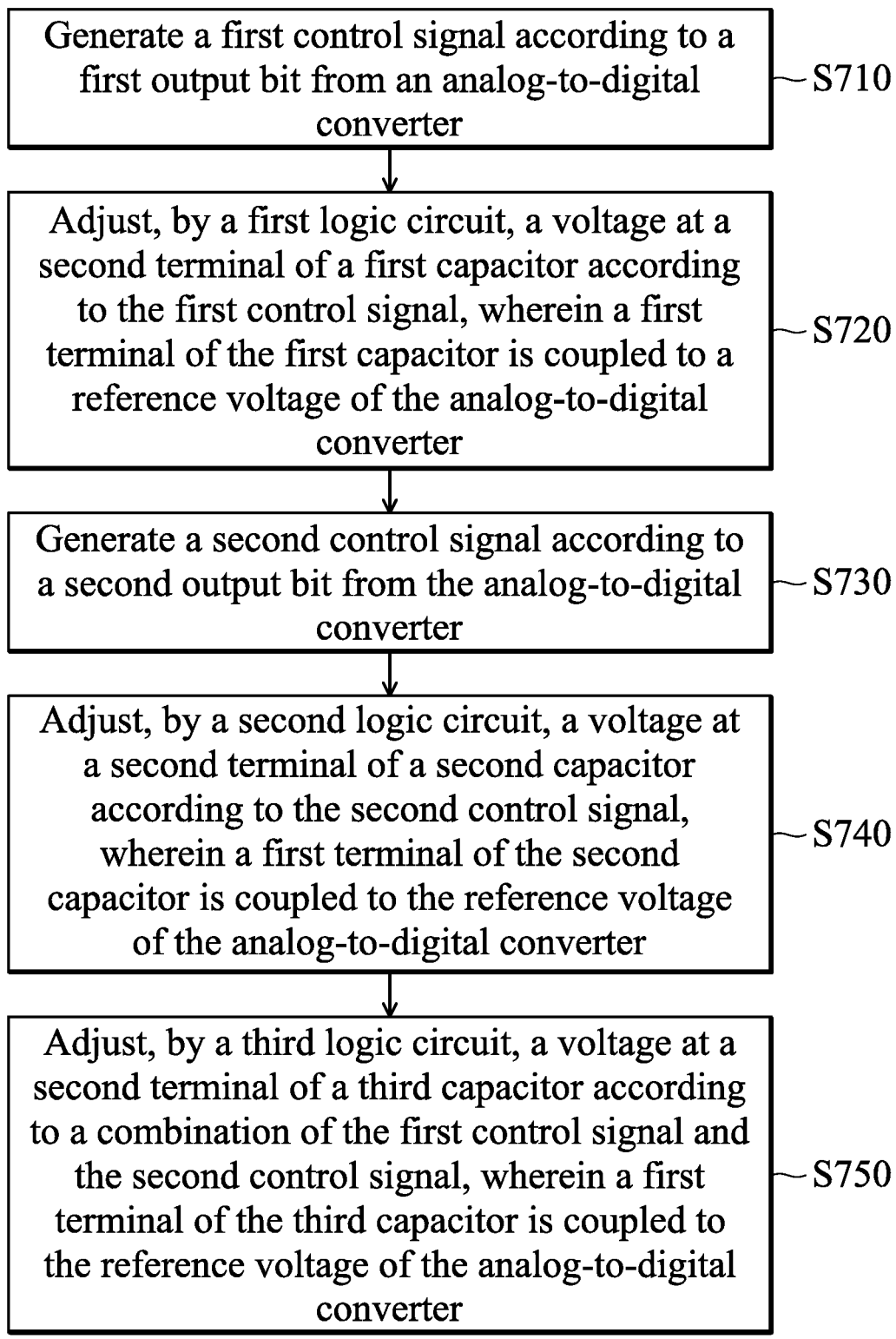
FIG. 7 is a flowchart of a method for charge compensation according to an embodiment of the invention.

FIG. 7 is a flowchart of a method for charge compensation according to an embodiment of the invention. The method at least includes steps S710 and S720. In step S710, a first control signal is generated according to a first output bit from an analog-to-digital converter. In step S720, a first logic circuit is used for adjusting a voltage at a second terminal of a first capacitor according to the first control signal. A first terminal of the first capacitor is coupled to a reference voltage of the analog-to-digital converter. The method may further include steps S730 to S750. In step S730, a second control signal is generated according to a second output bit from the analog-to-digital converter. In step S740, a second logic circuit is used for adjusting a voltage at a second terminal of a second capacitor according to the second control signal. A first terminal of the second capacitor is coupled to the reference voltage of the analog-to-digital converter. In step S750, a third logic circuit is used for adjusting the voltage at a second terminal of a third capacitor according to a combination of the first control signal and the second control signal. A first terminal of the third capacitor is coupled to the reference voltage of the analog-to-digital converter. The above steps S710 to S750 may not be performed in order. Each feature of the charge compensation circuit and the analog-to-digital converter, described in the embodiments FIGS. 1 to 6, may be also applied to the method of FIG. 7.

The invention proposes a charge compensation circuit applied to an analog-to-digital converter (ADC). The proposed charge compensation circuit uses a data-driven solution for stabilizing the reference voltage of the analog-to-digital converter. Therefore, the reliability of the reference voltage and the accuracy of the analog-to-digital converter can be significantly improved.

Note that the above voltages, currents, resistances, inductances, capacitances and other element parameters are not limitations of the invention. A designer can adjust these parameters according to different requirements. The charge compensation circuit and analog-to-digital converter of the invention are not limited to the configurations of FIGS. 1-7. The invention may merely include any one or more features of any one or more embodiments of FIGS. 1-7. In other words, not all of the features displayed in the figures should be implemented in the charge compensation circuit and analog-to-digital converter of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A charge compensation circuit for use in an analog-to-digital converter (ADC), comprising:
   a first capacitor, wherein a first terminal of the first capacitor is coupled to a reference voltage of the analog-to-digital converter; and
   a first logic circuit connected to a second terminal of the first capacitor, receiving a first control signal and directly applying a voltage to the second terminal of the first capacitor to stabilize the reference voltage according to the first control signal;
   wherein the first control signal is determined according to a first output bit from the analog-to-digital converter.

2. The charge compensation circuit as claimed in claim 1, wherein the analog-to-digital converter is a successive approximation register (SAR) analog-to-digital converter.

3. The charge compensation circuit as claimed in claim 1, further comprising:
   a second capacitor, wherein a first terminal of the second capacitor is coupled to the reference voltage of the analog-to-digital converter; and
   a second logic circuit, adjusting a voltage at a second terminal of the second capacitor according to a second control signal;
   wherein the second control signal is determined according to a second output bit from the analog-to-digital converter.

4. The charge compensation circuit as claimed in claim 3, wherein the first output bit and the second output bit are sequentially generated by the analog-to-digital converter.

5. The charge compensation circuit as claimed in claim 3, wherein the second logic circuit comprises a second buffer coupled between the supply voltage and a ground voltage, an input terminal of the second buffer is arranged for receiving the second control signal, and an output terminal of the second buffer is coupled to the second terminal of the second capacitor.

6. The charge compensation circuit as claimed in claim 3, further comprising:
   a third capacitor, wherein a first terminal of the third capacitor is coupled to the reference voltage of the analog-to-digital converter; and
   a third logic circuit, adjusting a voltage at a second terminal of the third capacitor according to a combination of the first control signal and the second control signal.

7. The charge compensation circuit as claimed in claim 6, wherein the third logic circuit comprises an XOR gate and a third buffer coupled between a supply voltage and a ground voltage.

8. The charge compensation circuit as claimed in claim 7, wherein a first input terminal of the XOR gate is arranged for receiving the first control signal, a second input terminal of the XOR gate is arranged for receiving the second control signal, an output terminal of the XOR gate is coupled to an input terminal of the third buffer, and an output terminal of the third buffer is coupled to the second terminal of the third capacitor.

9. An analog-to-digital converter, comprising:
   a charge compensation circuit, comprising:
   a first capacitor, wherein a first terminal of the first capacitor is coupled to a reference voltage; and
   a first logic circuit connected to a second terminal of the first capacitor, receiving a first control signal and directly applying a voltage to the second terminal of the first capacitor to stabilize the reference voltage according to the first control signal.

10. The analog-to-digital converter as claimed in claim 9, further comprising:
    a first capacitor array, having a first input node, and coupled to the reference voltage;
    a second capacitor array, having a second input node, and coupled to the reference voltage;
    a comparator, wherein a first input terminal of the comparator is coupled to the first capacitor array, and a second input terminal of the comparator is coupled to the second capacitor array;
    a successive approximation register (SAR) logic circuit, coupled to an output terminal of the comparator, and generating a first output bit;
    a current source, supplying a current to the reference voltage; and
    a resistor, coupled between the reference voltage and a ground voltage;
    wherein the first control signal is determined according to the first output bit.

11. The analog-to-digital converter as claimed in claim 10, wherein the charge compensation circuit further comprises:
    a second capacitor, wherein a first terminal of the second capacitor is coupled to the reference voltage; and a second logic circuit, adjusting a voltage at a second terminal of the second capacitor according to a second control signal;

wherein the successive approximation register logic circuit sequentially generates the first output bit and a second output bit;

wherein the second control signal is determined according to the second output bit.

12. The analog-to-digital converter as claimed in claim 11, wherein the second logic circuit comprises a second buffer coupled between a supply voltage and the ground voltage, an input terminal of the second buffer is arranged for receiving the second control signal, and an output terminal of the second buffer is coupled to the second terminal of the second capacitor.

13. The analog-to-digital converter as claimed in claim 11, wherein the charge compensation circuit further comprises:

a third capacitor, wherein a first terminal of the third capacitor is coupled to the reference voltage; and a third logic circuit, adjusting a voltage at a second terminal of the third capacitor according to a combination of the first control signal and the second control signal.

14. The analog-to-digital converter as claimed in claim 13, wherein the third logic circuit comprises an XOR gate and a third buffer coupled between the supply voltage and the ground voltage.

15. The charge compensation circuit as claimed in claim 14, wherein a first input terminal of the XOR gate is arranged for receiving the first control signal, a second input terminal of the XOR gate is arranged for receiving the second control signal, an output terminal of the XOR gate is coupled to an input terminal of the third buffer, and an output terminal of the third buffer is coupled to the second terminal of the third capacitor.

16. A method for charge compensation, comprising the steps of:

generating a first control signal according to a first output bit from an analog-to-digital converter; and using a first logic circuit to receive the first control signal and directly apply a voltage to a second terminal of a first capacitor according to the first control signal to stabilize a reference voltage, wherein a first terminal of the first capacitor is coupled to the reference voltage of the analog-to-digital converter.

17. The method as claimed in claim 16, further comprising:

generating a second control signal according to a second output bit from the analog-to-digital converter; and adjusting, by a second logic circuit, a voltage at a second terminal of a second capacitor according to the second control signal, wherein a first terminal of the second capacitor is coupled to the reference voltage of the analog-to-digital converter.

18. The method as claimed in claim 17, further comprising:

adjusting, by a third logic circuit, a voltage at a second terminal of a third capacitor according to a combination of the first control signal and the second control signal, wherein a first terminal of the third capacitor is coupled to the reference voltage of the analog-to-digital converter.

19. The charge compensation circuit as claimed in claim 1, wherein the first logic circuit comprises a first buffer coupled between a supply voltage and a ground voltage, an input terminal of the first buffer is arranged for receiving the first control signal, and an output terminal of the first buffer is coupled to the second terminal of the first capacitor.

20. The charge compensation circuit as claimed in claim 1, wherein when the reference voltage is discharged by a circuit of the analog-to-digital converter, the first logic circuit directly applies the voltage to the second terminal of the first capacitor to charge the reference voltage to stabilize the reference voltage.

21. The charge compensation circuit as claimed in claim 20, wherein the circuit is a capacitor array coupled to the reference voltage, the capacitor array is controlled by a switching signal, and the switching signal is determined according to the first output bit from the analog-to-digital converter.

22. The analog-to-digital converter as claimed in claim 9, wherein the first logic circuit comprises a first buffer coupled between a supply voltage and a ground voltage, an input terminal of the first buffer is arranged for receiving the first control signal, and an output terminal of the first buffer is coupled to the second terminal of the first capacitor.

23. The analog-to-digital converter as claimed in claim 10, further comprising:

a circuit coupled to the reference voltage;

wherein when the reference voltage is discharged by the circuit of the analog-to-digital converter, the first logic circuit directly applies the voltage to the second terminal of the first capacitor to charge the reference voltage to stabilize the reference voltage.

24. The analog-to-digital converter as claimed in claim 23, wherein the circuit is a capacitor array coupled to the reference voltage, the capacitor array is controlled by a switching signal, and the switching signal is determined according to the first output bit from the analog-to-digital converter.

25. The method as claimed in claim 16, wherein the first logic circuit comprises a first buffer coupled between a supply voltage and a ground voltage, an input terminal of the first buffer is arranged for receiving the first control signal, and an output terminal of the first buffer is coupled to the second terminal of the first capacitor.

26. The method as claimed in claim 16, wherein when the reference voltage is discharged by a circuit of the analog-to-digital converter, the first logic circuit directly applies the voltage to the second terminal of the first capacitor to charge the reference voltage to stabilize the reference voltage.

27. The method as claimed in claim 26, wherein the circuit is a capacitor array coupled to the reference voltage, and the method further comprises:

generating a switching signal according to the first output bit from the analog-to-digital converter; and using the switching signal to control the capacitor array.

* * * * *